US012804849B2

(12) United States Patent
Chehade

(10) Patent No.: US 12,804,849 B2
(45) Date of Patent: Nov. 17, 2026

(54) SHARING DATACENTER LIQUID COOLING RESOURCES IN CASE OF COMPONENT FAILURE

(71) Applicant: OVH, Roubaix (FR)

(72) Inventor: Ali Chehade, Moncheaux (FR)

(73) Assignee: OVH, Roubaix (FR)

( * ) Notice: Subject to any disclaimer, the term of this patent is extended or adjusted under 35 U.S.C. 154(b) by 251 days.

(21) Appl. No.: 18/799,577

(22) Filed: Aug. 9, 2024

(65) Prior Publication Data

US 2025/0081394 A1 Mar. 6, 2025

(30) Foreign Application Priority Data

Aug. 31, 2023 (EP) .................................... 23306450

(51) Int. Cl.
*H05K 7/20* (2006.01)

(52) U.S. Cl.
CPC ..... *H05K 7/20272* (2013.01); *H05K 7/20772* (2013.01); *H05K 7/20836* (2013.01)

(58) Field of Classification Search
CPC ........... H05K 7/20272; H05K 7/20281; H05K 7/20763; H05K 7/20781; H05K 7/2079; H05K 7/20836; H05K 7/20218; H05K 7/20772; G06F 1/206; G06F 2200/201; G06F 11/3058
See application file for complete search history.

(56) References Cited

U.S. PATENT DOCUMENTS

2017/0181328 A1* 6/2017 Shelnutt .................... G06F 1/20
2024/0074103 A1* 2/2024 Hnayno ............. H05K 7/20272

FOREIGN PATENT DOCUMENTS

CN 210519308 U 5/2020
CN 210725802 U 6/2020
CN 213818699 U 7/2021

(Continued)

OTHER PUBLICATIONS

Liu et al., CN-114025599-A, Electromagnetic Suppression Structure of Electric Control Box of Refrigeration Device and Refrigeration Device, Feb. 8, 2022, PE2E search (Year: 2022).*

(Continued)

*Primary Examiner* — Michael A Matey
(74) *Attorney, Agent, or Firm* — BCF LLP

(57) ABSTRACT

A datacenter liquid cooling resource sharing system and process is presented that comprises two liquid cooling arrangements having a common liquid sharing support circuit between the two arrangements that incorporates respective first switchover control valves coupled to the forward cooling liquid supply and respective second switchover control valves coupled to the return heated liquid supply. In response to receiving data indicating a detected liquid flow failure, the first or second control module panels identify which of the forward liquid cooling circuits has detected a liquid flow failure, shut down the respective forward cooling liquid circuit and return heated liquid circuit, open the first switchover valve to route a suitable portion of the cooling liquid flow from the operational forward liquid circuit to the failing forward liquid circuit, and open the second switchover valve to route a suitable portion of the heated liquid flow from the failing return liquid circuit to the operational return liquid circuit.

15 Claims, 3 Drawing Sheets

(56) References Cited

FOREIGN PATENT DOCUMENTS

| | | | | | |
|---|---|---|---|---|---|
| CN | 217817535 | U | | 11/2022 | |
| CN | 115682806 | A | | 2/2023 | |
| DE | 10029661 | A1 | | 1/2002 | |
| EP | 4084594 | A1 | * | 11/2022 | ......... H05K 7/20781 |
| EP | 4084594 | B1 | | 4/2023 | |

OTHER PUBLICATIONS

Thordarson et al., CN-104853565-B, Integrated Cooling System For Electronic Testing Device, Jul. 12, 2019, PE2E search (Year: 2019).*

Teng et al. CN-210519308-U, A Data Centre Plate Cooled Liquid Cooling System, May 12, 2020, PE2E search (Year: 2020).*

Wang et al., CN-115682806-A, Cooling System, Data Centre Machine Room and Control Method of Cooling System, Feb. 3, 2023, PE2E search (Year: 2023).*

Communication with regard to the counterpart EP Patent Application No. 23306450.0 issued Sep. 19, 2025.

European Search Report to the counterpart EP Patent Application No. 23306450.0 completed on Mar. 14, 2024.

* cited by examiner

SHARING DATACENTER LIQUID COOLING RESOURCES IN CASE OF COMPONENT FAILURE

CROSS REFERENCE

The present application claims priority to EP application No 23306450.0 entitled "SHARING DATACENTER LIQUID COOLING RESOURCES IN CASE OF COMPONENT FAILURE", filed Aug. 31, 2023, the entirety of which is incorporated herein by reference.

FIELD

The present technology generally relates to the field of datacenter liquid cooling arrangements and, in particular, to the sharing of datacenter liquid cooling resources in the event of flow component failures.

BACKGROUND

Datacenters as well as many computer processing facilities house multitudes rack-mounted electronic processing equipment. In operation, such electronic processing equipment generates a substantial amount of heat that must be dissipated in order avoid electronic component failures and ensure continued efficient processing operations.

To this end, various liquid cooling measures have been implemented to facilitate the dissipation of heat generated by the electronic processing equipment. One such measure employs liquid block cooling techniques for directly cooling one or more heat-generating processing components. This technique utilizes liquid cooling blocks having internal channels that receive cooling liquid from a cooling liquid source that are in thermal contact with the heat-generating processing components.

Depending on the access to water resources, in many cases, the preferred cooling liquid source comprises a dry cooling unit. Dry cooling units supply cooling liquid via pumps to rack-mounted electronic processing equipment as well as receive heated liquid from the electronic processing equipment and are configured to re-cool the received heated liquid for circulation back to the electronic processing equipment.

At times, certain components crucial to liquid flow of the liquid cooling arrangement, such as, for example, pumps or dry cooling unit, fail. The failure of such flow components can result in damaging effects to the multitudes of the heat-generating processing components serviced by the liquid cooling arrangement.

As such, there remains an interest in attempting to minimize the damaging effects due to crucial flow component failures of a single liquid cooling arrangement by sharing liquid cooling components/resources of other liquid cooling arrangements.

The subject matter discussed in the background section should not be assumed to be prior art merely as a result of its mention in the background section. Similarly, a problem mentioned in the background section or associated with the subject matter of the background section should not be assumed to have been previously recognized in the prior art. The subject matter in the background section merely represents different approaches.

SUMMARY

Embodiments of the present technology have been developed based on certain drawbacks associated with conventional dry cooling techniques and implementations.

In one aspect of the inventive concepts, the present technology provides a datacenter liquid cooling system comprising a first cooling arrangement comprising a first dry cooling unit configured to supply a cooling liquid to the rack-mounted processing assemblies and receive a heated liquid from the rack-mounted processing assemblies, a first forward liquid distribution circuit including a temperature sensor, at least one first pump, a pump pressure sensor, a liquid flow volume sensor, and a forward smart control or solenoid valve to convey the cooling liquid from the dry cooling unit to the rack-mounted processing assemblies, a first return liquid distribution circuit including a return smart control solenoid valve to convey the heated liquid from the rack-mounted processing assemblies back to the first dry cooling unit and a temperature sensor, a first control module panel communicatively-coupled to the temperature sensor, pump pressure sensor, liquid flow volume sensor, temperature sensor, and forward smart control or solenoid valve to receive data therefrom, each of the rack-mounted data processing assemblies comprising at least one heat-generating electronic processing element and at least one liquid cooling block arranged to be in respective thermal contact with the at least one heat-generating electronic processing element and fluidly-coupled to the first forward liquid distribution circuit and smart flow valves respectively arranged to be fluidly-coupled to the at least one liquid cooling block of the corresponding rack-mounted data processing assembly, and a second cooling arrangement comprising a second dry cooling unit configured to supply a cooling liquid to the rack-mounted processing assemblies and receive a heated liquid from the rack-mounted processing assemblies, a second forward liquid distribution circuit including a temperature sensor, at least one second pump, a pump pressure sensor, a liquid flow volume sensor, and a forward smart control or solenoid valve, a second return liquid distribution circuit including a return smart control solenoid valve to convey the heated liquid from the rack-mounted processing assemblies back to the first dry cooling unit and a temperature sensor, a second control module panel communicatively-coupled to the temperature sensor, pump pressure sensor, liquid flow volume sensor, temperature sensor, and forward smart control or solenoid valve to receive data therefrom, each of the rack-mounted data processing assemblies comprising at least one heat-generating electronic processing element and at least one liquid cooling block arranged to be in respective thermal contact with the at least one heat-generating electronic processing element and fluidly-coupled to the first liquid distribution circuit and smart control valves respectively arranged to be fluidly-coupled to the at least one liquid cooling block of the corresponding rack-mounted data processing assembly.

The datacenter liquid cooling system further incorporates a liquid sharing support circuit comprising a first switchover control valve fluidly coupled to the forward liquid distribution circuits of the corresponding first and second cooling arrangements that convey the cooling liquid from the dry cooling units, a second switchover control valve fluidly coupled to the return liquid distribution circuits of the corresponding first and second cooling arrangements that convey the heated liquid back to the dry cooling units; and wherein, in response to receiving data indicating a detected liquid flow failure, the first or second control module panels operate to: identify which of the forward liquid cooling circuits has experienced a detected liquid flow failure, shut down the respective forward cooling liquid distribution circuit and return heated liquid distribution circuit of the identified flow failing first or second cooling arrangements, open the first switchover valve to route a suitable portion of the cooling liquid flow from the operational forward liquid distribution circuit to the identified failing forward liquid distribution circuit, and open the second switchover valve to route a suitable portion of the heated liquid flow from the identified failing return liquid distribution circuit to the operational return liquid distribution circuit.

The datacenter liquid cooling system also provides that the first switchover valve is fluidly coupled to the forward liquid distribution circuits at respective coupling points that are proximately disposed downstream from the forward smart control valves and upstream from the respective processing assemblies and that the second switchover valve is fluidly coupled to the return liquid distribution circuits at respective coupling points that are proximately disposed downstream from the respective processing assemblies and upstream from the return smart control valves.

The datacenter liquid cooling system additionally provides that each of the control panel modules are configured to monitor the received data from the respective the temperature sensors, pump pressure sensors, volume sensors, and forward smart control/solenoid valves to determine a detected liquid flow failure and issue alerts regarding corresponding detected liquid flow failures of a cooling arrangement.

The datacenter liquid cooling system further provides that after opening the first and second switchover valves, the control panel modules operate to activate both pumps of the operational forward liquid circuit to maximize liquid cooling flow routed to the identified failing cooling arrangement.

The datacenter liquid cooling system also provides that after opening the first and second switchover valves, the control panel modules operate to increase the speed of the fan assemblies of the dry cooling unit pertaining to the operational cooling arrangement to maximize the cooling liquid flow routed to the identified failing cooling arrangement.

In a related aspect of the inventive concepts, the present technology provides a datacenter liquid cooling resource sharing method, in which the datacenter includes a first dry cooling unit configured to supply a cooling liquid to the rack-mounted processing assemblies and receive a heated liquid from the rack-mounted processing assemblies, a first forward liquid distribution circuit including a temperature sensor, at least one first pump, a pump pressure sensor, a liquid flow volume sensor, and a forward smart control or solenoid valve to convey the cooling liquid from the dry cooling unit to the rack-mounted processing assemblies, a first return liquid distribution circuit including a return smart control solenoid valve to convey the heated liquid from the rack-mounted processing assemblies back to the first dry cooling unit and a temperature sensor, a first control module panel communicatively-coupled to the temperature sensor, pump pressure sensor, liquid flow volume sensor, temperature sensor, and forward smart control or solenoid valve to receive data therefrom, each of the rack-mounted data processing assemblies comprising at least one heat-generating electronic processing element and at least one liquid cooling block arranged to be in respective thermal contact with the at least one heat-generating electronic processing element and fluidly-coupled to the first forward liquid distribution circuit and smart flow valves respectively arranged to be fluidly-coupled to the at least one liquid cooling block of the corresponding rack-mounted data processing assembly, and a second cooling arrangement comprising a second dry cooling unit configured to supply a cooling liquid to the rack-mounted processing assemblies and receive a heated liquid from the rack-mounted processing assemblies, a second forward liquid distribution circuit including a temperature sensor, at least one second pump, a pump pressure sensor, a liquid flow volume sensor, and a forward smart control or solenoid valve, a second return liquid distribution circuit including a return smart control solenoid valve to convey the heated liquid from the rack-mounted processing assemblies back to the first dry cooling unit and a temperature sensor, a second control module panel communicatively-coupled to the temperature sensor, pump pressure sensor, liquid flow volume sensor, temperature sensor, and forward smart control or solenoid valve to receive data therefrom, each of the rack-mounted data processing assemblies comprising at least one heat-generating electronic processing element and at least one liquid cooling block arranged to be in respective thermal contact with the at least one heat-generating electronic processing element and fluidly-coupled to the first liquid distribution circuit and smart control valves respectively arranged to be fluidly-coupled to the at least one liquid cooling block of the corresponding rack-mounted data processing assembly, in which the liquid cooling method comprises providing a liquid sharing support circuit with a first switchover control valve fluidly coupled to the forward liquid distribution circuits of the corresponding first and second cooling arrangements that convey the cooling liquid from the dry cooling units, a second switchover control valve fluidly coupled to the return liquid distribution circuits of the corresponding first and second cooling arrangements that convey the heated liquid back to the dry cooling units wherein, in response to receiving data indicating a detected liquid flow failure, the first or second control module panels identifying which of the forward liquid cooling circuits has experienced a detected liquid flow failure, shutting down the respective forward cooling liquid distribution circuit and return heated liquid distribution circuit of the identified flow failing first or second cooling arrangements, opening the first switchover valve to route a suitable portion of the cooling liquid flow from the operational forward liquid distribution circuit to the identified failing forward liquid distribution circuit, and opening the second switchover valve to route a suitable portion of the heated liquid flow from the identified failing return liquid distribution circuit to the operational return liquid distribution circuit.

The datacenter liquid cooling method also provides for monitoring by each of the control panel modules of the received data from the respective the temperature sensors, pump pressure sensors, volume sensors, and forward smart control/solenoid valves to determine a detected liquid flow failure as well as issuing alerts regarding corresponding detected liquid flow failures of a cooling arrangement.

The datacenter liquid cooling method further provides that, after opening the first and second switchover valves, the control panel modules activating both pumps of the operational forward liquid circuit to maximize liquid cooling flow routed to the identified failing cooling arrangement.

The datacenter liquid cooling method further provides that, after opening the first and second switchover valves increasing the speed of the fan assemblies of the dry cooling unit pertaining to the operational cooling arrangement to maximize the cooling liquid flow routed to the identified failing cooling arrangement.

In the context of the present specification, unless expressly provided otherwise, a computer system may refer, but is not limited to, an "electronic device", an "operation system", a "system", a "computer-based system", a "controller unit", a "monitoring device", a "control device" and/or any combination thereof appropriate to the relevant task at hand.

In the context of the present specification, unless expressly provided otherwise, the expression "computer-readable medium" and "memory" are intended to include media of any nature and kind whatsoever, non-limiting examples of which include RAM, ROM, disks (CD-ROMs, DVDs, floppy disks, hard disk drives, etc.), USB keys, flash memory cards, solid state-drives, and tape drives. Still in the context of the present specification, "a" computer-readable medium and "the" computer-readable medium should not be construed as being the same computer-readable medium. To the contrary, and whenever appropriate, "a" computer-readable medium and "the" computer-readable medium may also be construed as a first computer-readable medium and a second computer-readable medium.

In the context of the present specification, unless expressly provided otherwise, the words "first", "second", "third", etc. have been used as adjectives only for the purpose of allowing for distinction between the nouns that they modify from one another, and not for the purpose of describing any particular relationship between those nouns.

Implementations of the present technology each have at least one of the above-mentioned object and/or aspects, but do not necessarily have all of them. It should be understood that some aspects of the present technology that have resulted from attempting to attain the above-mentioned object may not satisfy this object and/or may satisfy other objects not specifically recited herein.

Additional and/or alternative features, aspects and advantages of implementations of the present technology will become apparent from the following description, the accompanying drawings and the appended claims.

BRIEF DESCRIPTION OF THE DRAWINGS

For a better understanding of the present technology, as well as other aspects and further features thereof, reference is made to the following description which is to be used in conjunction with the accompanying drawings, where.

Figure 1:
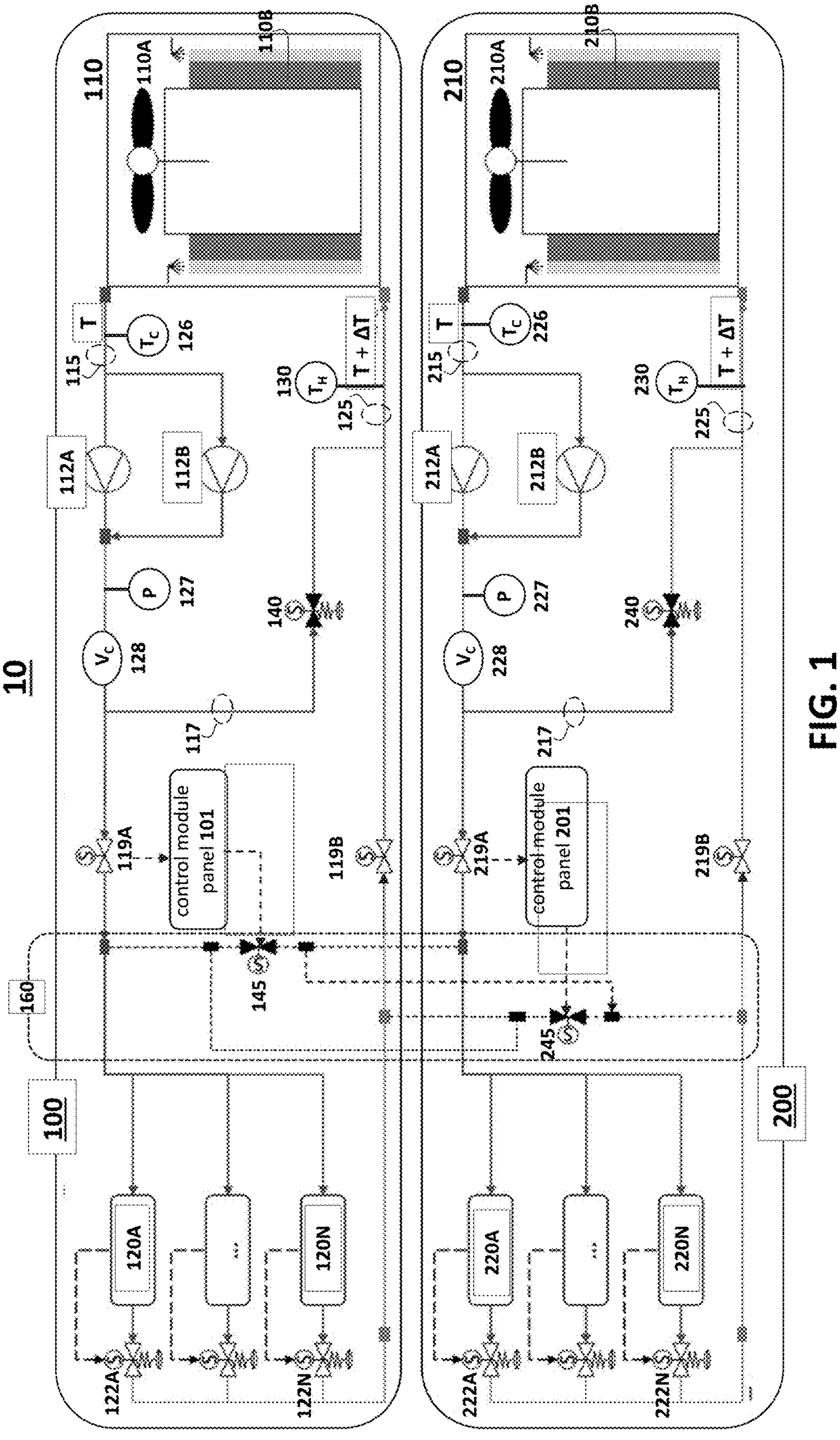
FIG. 1 illustrates a high-level functional block diagram of a datacenter liquid cooling system comprising two liquid arrangements with sharing support capability, in accordance with the nonlimiting embodiments of the present technology.

It should be appreciated that, unless otherwise explicitly specified herein, the drawings are not to scale.

DETAILED DESCRIPTION

The examples and conditional language recited herein are principally intended to aid the reader in understanding the principles of the present technology and not to limit its scope to such specifically recited examples and conditions. It will be appreciated that those skilled in the art may devise various arrangements that, although not explicitly described or shown herein, nonetheless embody the principles of the present technology.

Furthermore, as an aid to understanding, the following description may describe relatively simplified implementations of the present technology. As persons skilled in the art would understand, various implementations of the present technology may be of a greater complexity.

In some cases, what are believed to be helpful examples of modifications to the present technology may also be set forth. This is done merely as an aid to understanding, and, again, not to define the scope or set forth the bounds of the present technology. These modifications are not an exhaustive list, and a person skilled in the art may make other modifications while nonetheless remaining within the scope of the present technology. Further, where no examples of modifications have been set forth, it should not be interpreted that no modifications are possible and/or that what is described is the sole manner of implementing that element of the present technology.

Moreover, all statements herein reciting principles, aspects, and implementations of the present technology, as well as specific examples thereof, are intended to encompass both structural and functional equivalents thereof, whether they are currently known or developed in the future. Thus, for example, it will be appreciated by those skilled in the art that any block diagrams herein represent conceptual views of illustrative circuitry embodying the principles of the present technology. Similarly, it will be appreciated that any flowcharts, flow diagrams, state transition diagrams, pseudo-code, and the like represent various processes that may be substantially represented in non-transitory computer-readable media and so executed by a computer or processor, whether or not such computer or processor is explicitly shown.

The functions of the various elements shown in the FIGS. including any functional block labeled as a "processor", may be provided through the use of dedicated hardware as well as hardware capable of executing software in association with appropriate software. When provided by a processor, the functions may be provided by a single dedicated processor, by a single shared processor, or by a plurality of individual processors, some of which may be shared. In some embodiments of the present technology, the processor may be a general-purpose processor, such as a central processing unit (CPU) or a processor dedicated to a specific purpose, such as a digital signal processor (DSP). Moreover, explicit use of the term a "processor" should not be construed to refer exclusively to hardware capable of executing software, and may implicitly include, without limitation, application specific integrated circuit (ASIC), field programmable gate array (FPGA), read-only memory (ROM) for storing software, random access memory (RAM), and non-volatile storage. Other hardware, conventional and/or custom, may also be included.

Software modules, or simply modules which are implied to be software, may be represented herein as any combination of flowchart elements or other elements indicating performance of process steps and/or textual description. Such modules may be executed by hardware that is expressly or implicitly shown. Moreover, it should be understood that module may include for example, but without being limitative, computer program logic, computer program instructions, software, stack, firmware, hardware circuitry or a combination thereof which provides the required capabilities.

Equally noteworthy, while various operations of the inventive concepts may be represented by flowchart elements arranged in certain sequential order, it should be understood that these steps may be combined, sub-divided, re-ordered, or changed to operate concurrently without departing from the teachings of the present technology. In fact, at least some of the processing steps may be executed in parallel or in series. Accordingly, the ordering, sequencing, and grouping of the processing steps is not a limitation of the present technology.

Given this fundamental understanding, the disclosed embodiments are directed to a system and method configured to minimize the damaging effects due to crucial flow component failures of a single liquid cooling arrangement by sharing liquid cooling components/resources of other liquid cooling arrangements.

FIG. 1 illustrates a high-level functional block diagram of a datacenter liquid cooling system 10 comprising two liquid cooling arrangements 100, 200 with sharing support capabilities 145, 245 for cooling corresponding rack-mounted processing assemblies, in accordance with the nonlimiting embodiments of the present technology.

As shown, the first liquid cooling arrangement 100 of system 10 includes a dry cooling unit 110, a plurality of rack-mounted processing assemblies 120A-120N, a plurality of smart valves 122A-122N in which each smart valve is fluidly-coupled to a respective processing assembly, a forward liquid distribution circuit 115 incorporating at least one pump 112A, 112B for supplying cooling liquid from the dry cooling unit 110, a return liquid distribution circuit 125 for returning heated liquid back to the dry cooling unit 110, an auxiliary liquid feed circuit 117 for supplementing the cooling liquid flow back to the dry cooling unit 110, and a control module panel 101 communicatively coupled to various components and sensors.

Similarly, the second liquid cooling arrangement 200 of system 10 includes a dry cooling unit 210, a plurality of rack-mounted processing assemblies 220A-220N, a plurality of smart valves 222A-222N in which each smart valve is fluidly-coupled to a respective processing assembly, a forward liquid distribution circuit 215 incorporating at least one pump 212A, 212B for supplying cooling liquid from the dry cooling unit 210, a return liquid distribution circuit 225 for returning heated liquid back to the dry cooling unit 210, an auxiliary liquid feed circuit 217 for supplementing the cooling liquid flow back to the dry cooling unit 210, and a control module panel 201 communicatively coupled to various components and sensors.

Each of the dry cooling units 110, 210 may be located on any suitable stable support surface, such as, for example, the roof of a datacenter/computer processing facility building. The dry cooling units 110, 210 serve to dissipate thermal energy from a heated liquid circulating therethrough to the ambient environment. For example, in a datacenter or similar facility, the dry cooling units 110, 210 operate to receive heated liquid from the respective rack-mounted processing assemblies 120A-120N, 220A-220N and extract the thermal energy from the heated liquid by dissipating the energy into the ambient environment via the respective at least one fan assemblies 110A, 210A to thereby re-cool the heated liquid. The dry cooling units 110, 210 then operate to supply the re-cooled liquid back to the respective rack-mounted processing assemblies 120A-120N, 220A-220N.

As shown, each of the dry cooling units 110, 210 respectively include at least one heat exchanger 110B, 210B and at least one fan assembly 110A, 210A. The heat exchangers 110B, 210B may manifest a variety of configurations, such as, air-to-liquid heat exchanger etc., and may further include evaporating or cooling pads. For purposes of the instant disclosure, the exact configuration of the dry cooling units 110, 210 and heat exchangers 110B, 210B is not limiting, as various configurations could be employed without departing from the concepts of the instant disclosure.

As also shown, the forward liquid distribution circuits 115, 215 incorporate at least one pump 112A, 212A. In the depicted embodiment, the forward liquid distribution circuits 115, 215 respectively employ two pumps 112A, 112B and 212A, 212B, each respective set being arranged in a parallel configuration to maintain the flow rate of the cooling/re-cooled liquid supplied to the processing assemblies 120A-120N, 220A-220N at an adequate level.

The forward liquid distribution circuits 115, 215 also incorporate respective forward "smart" control valves 119A, 219A. For purposes of the instant disclosure, the term "smart" valve refers to a valve that is pressure-independent, temperature-responsive, incorporates a differential pressure regulator to automatically adjust to system pressure changes as well as shut down given certain operational conditions. Such smart valves may comprise PICVs, ABQMs, other functionally similar valves, or combinations of valves, such as a solenoid valve combined with a control valve. In this implementation, the smart control valves 119A, 219A are configured to sense and adjust the flow of the cooling/re-cooled liquid supplied to the processing assemblies 120A-120N, 220A-220N. As discussed in greater detail below, the forward smart control valves 119A, 219A are also communicatively coupled to respective control module panels 101, 201 to provide notification of a liquid flow or component failure, such as, for example mechanical/electrical failure of pumps or fan assemblies.

The heated liquid from the rack-mounted processing assemblies 120A-120N, 220A-220N is returned back to the dry cooling units 110, 210 for re-cooling via the respective return liquid distribution circuits 125, 225. The return liquid distribution circuits 125, 225 also incorporate return smart control valves 119B, 219B that are configured to sense and adjust the flow of the heated liquid returned back to the dry cooling units 110, 210.

As depicted, the dry cooling units 110, 210 supply the cooling/re-cooled liquid to the respective rack-mounted processing assemblies 120A-120N, 220A-220N at a nominal temperature T and the heated liquid returned to the dry cooling units 110, 210 is at a nominal temperature $T+\Delta T$, where $\Delta T$ represents the temperature differential between the cooling/re-cooled liquid and the heated liquid.

The liquid cooling arrangements 100, 200 of system 10 respectively include a plurality of rack-mounted processing assemblies 120A-120N, 220A-220N which receive the supplied cooling/re-cooled liquid via the corresponding forward liquid distribution circuits 115, 215 to internally channel the cooling liquid to the heat-generating processing components (e.g., water circulated through water blocks), and convey the heated liquid from the heat-generating processing components to the return liquid distribution circuit 125, 225.

The rack-mounted processing assemblies 120A-120N, 220A-220N may or may not be configured with similar heat-generating processing components. As such, each of the rack-mounted processing assemblies 120A-120N, 220A-220N may have different temperature and flow rate requirements for proper operations.

It will be appreciated that, while the rack-mounted processing assemblies 120A-120N, 220A-220N are depicted to be arranged in a parallel configuration, it is not meant to be limiting, as the processing assemblies 120A-120N, 220A-220N may also be arranged in a serial or combined parallel and serial configuration without departing from the concepts of the instant disclosure.

As shown, each of the rack-mounted processing assemblies 120A-120N, 220A-220N is fluidly-coupled to a smart valve 122A-122N, 222A-222N that dynamically controls the flow rate of the corresponding processing assembly 120A-120N, 220A-220N based on detected liquid temperatures.

Along the forward liquid distribution circuits 115, 215, liquid cooling arrangements 100, 200 also incorporate temperature sensors 126, 226 for measuring the temperature of the supplied cooling liquid $T_C$, flow pressure sensors 127, 227 for measuring the pressure of the flow of the supplied liquid P, and volume sensors 128, 228 for measuring the flow rate of the supplied cooling liquid $V_C$.

For the return liquid distribution circuits 125, 225, liquid cooling arrangements 100, 200 also incorporate temperature sensors 125, 225 for measuring the temperature of the return heated liquid $T_H$.

The liquid cooling arrangements 100, 200 additionally incorporate corresponding bypass control valves 140, 240 that are fluidly-coupled to the auxiliary liquid feed circuits 117, 217 for supplementing the return liquid flow back to the dry cooling units 110, 210.

The system 10 further employs a liquid sharing support circuit 160 to enable the sharing/transfer of liquid cooling components/resources of the liquid cooling arrangements 100, 200 in the event of crucial flow component failures of either of the liquid cooling arrangements 100, 200. Such crucial flow component failures may include, for example, pump 112A, 112B, 212A, 212B failures and/or dry cooling unit 110, 210 failures.

In particular, the liquid sharing support circuit 160 implements a first switchover control valve or solenoid valve 145 that is fluidly coupled to the forward liquid distribution circuits 115, 215 of both the first and second cooling arrangements 100, 200. The fluid coupling point of the first switchover control valve 145 to each of the forward liquid distribution circuits 115, 215 is proximately disposed downstream from the forward smart control valves 119A, 219A and upstream from the respective processing assemblies 120A-120N, 220A-220N.

Commensurately, the liquid sharing support circuit 160 implements a second switchover control valve or solenoid valve 245 that is fluidly coupled to the return liquid distribution circuits 125, 225 of both first and second cooling arrangements 100, 200. The fluid coupling point of the second switchover control valve 245 to each of the return liquid distribution circuits 125, 225 is proximately disposed downstream from the respective processing assemblies 120A-120N, 220A-220N and upstream from the return smart control valves 119B, 219B.

As noted above, each of the liquid cooling arrangements 100, 200 also respectively incorporate control module panels 101, 201 that are communicatively-coupled to various components as well as flow, pressure, and temperature sensors. That is, for various nonlimiting embodiments, the control module panels 101, 201 are configured to receive data from the temperature sensors 126, 226, 130, 230, pressure sensors 127, 227, volume sensors 128, 228, and smart control valves 119A, 219A, process the data, and provide notifications to operators to address failure and maintenance issues.

Figure 3:
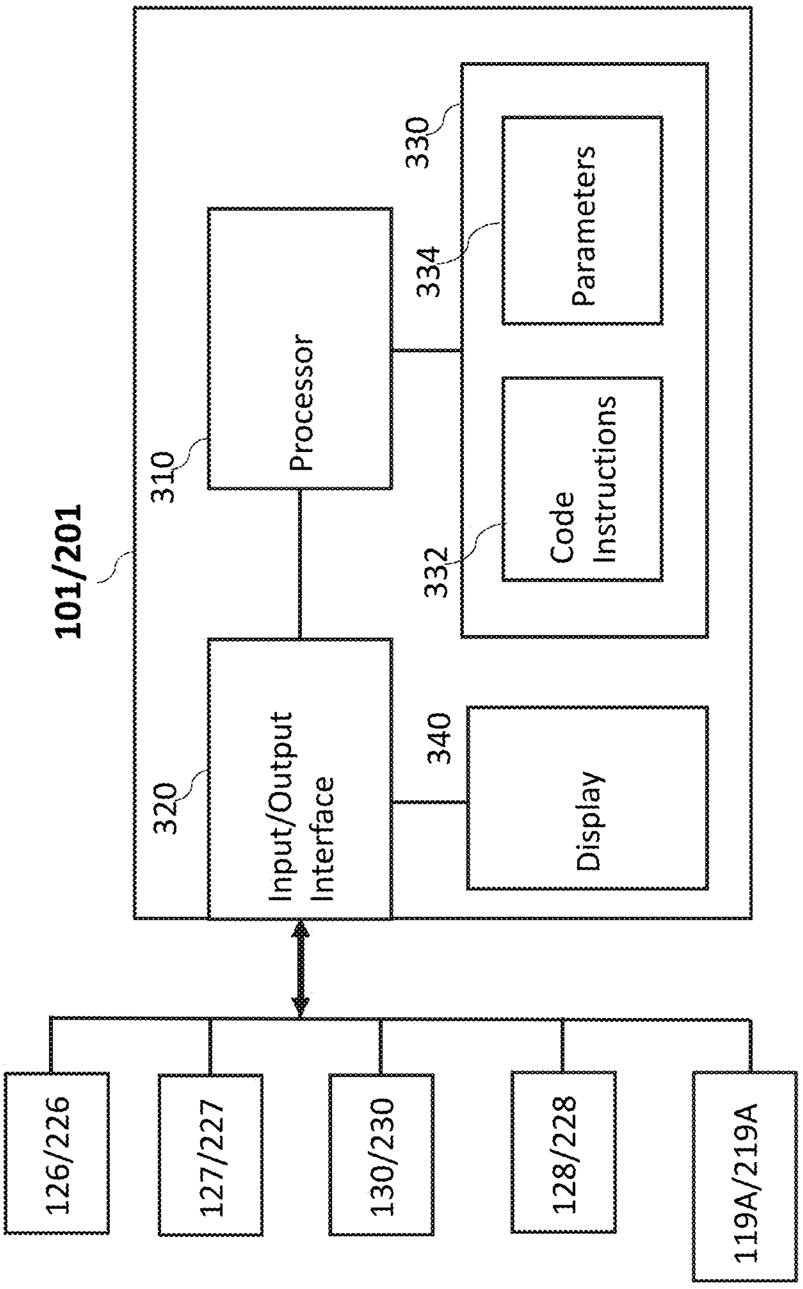
FIG. 3 illustrates a high-level functional block diagram of a representative control module panel of a datacenter liquid cooling system, in accordance with the nonlimiting embodiments of the present technology.

FIG. 3 illustrates a high-level functional block diagram of a representative control module panel 101/201 of a datacenter liquid cooling system, in accordance with the nonlimiting embodiments of the present technology. As shown, the control module panel 101/201 comprises a processor or a plurality of cooperating processors (represented as a processor 310 for simplicity), a memory device or a plurality of memory devices (represented as a memory device 330 for simplicity), and an input/output interface 320 (or separate input and output interfaces) allowing the control module panel 101/201 to communicate with certain components of the datacenter liquid cooling system 10. The processor 310 is operatively connected to the memory device 330 and to the input/output interface 320. The memory device 330 includes a storage for storing parameters 334, including for example and without limitation the above-mentioned predetermined conductivity thresholds. The memory device 330 may comprise a non-transitory computer-readable medium for storing code instructions 332 that are executable by the processor 310 to allow the control module panel 101/201 to perform the various tasks allocated to the controller control module panel 101/201.

Moreover, the controller control module panel 101/201 is operatively connected, via the input/output interface 320, to the components of the datacenter liquid cooling system 10, such as, temperature sensors 126, 226, 130, 230, pressure sensors 127, 227, volume sensors 128, 228, and smart control valves 119A, 219A. In addition, the controller control module panel 101/201 is operatively connected to a display device 340 configured to provide alerts and notifications to operators via visual and/or auditory means.

Returning to FIG. 1, control module panels 101, 201 are also communicatively-coupled to the forward smart control valves 119A, 219A of the corresponding forward liquid distribution circuits 115, 215 for both of the first and second cooling arrangements 100, 200. Accordingly, in the event that either of the forward smart control valves 119A/219A detects any type of liquid flow anomaly along one of the corresponding forward liquid distribution circuits 115/215, the relevant forward smart control valve 119A/219A provides information regarding the same to the corresponding control module panels 101/201.

Accordingly, responsive to notifications by the relevant forward smart control valve 119A/219A and/or the received data from the relevant temperature sensors 126, 226, 130, 230, pressure sensors 127, 227, and volume sensors 128, 228 of a detected liquid flow anomaly, the corresponding control module panel 101/201 issues an alert message to an operator indicating that one of the forward smart control valves 119A/219A has detected a cooling liquid flow anomaly that may be due to a component failure issues along a corresponding forward liquid distribution circuit 115/215.

In some embodiments, responsive to a detected issue, the operator may then activate the first switchover control/solenoid valve 145 to open and route a suitable portion of the cooling liquid flow from the operational (i.e., non-failing) forward liquid distribution circuit 115/215 to the processing assemblies 120A-120N/220A-220N of the failing forward liquid distribution circuit 115/215.

In other embodiments, responsive to a detected issue, the corresponding control module panel 101/201 may automatically activate the first switchover control/solenoid valve 145 to open and direct a suitable portion of the cooling liquid flow from the operational (i.e., non-failing) forward liquid distribution circuit 115/215 to the processing assemblies 120A-120N/220A-220N of the failing forward liquid distribution circuit 115/215.

Correspondingly, the operator may also activate the second switchover control valve/solenoid valve 245 to open and route a suitable portion of the heated liquid flow from the processing assemblies 120A-120N/220A-220N of the failing return liquid distribution circuit 125/225 to the operational return liquid distribution circuit 125/225 for re-cooling by the dry cooling unit 110/210 pertaining to the operational return liquid distribution circuit 125/225.

As noted above, because the forward smart control valves 119A/219A are configured to dynamically adjust to system pressure changes, the smart control valves 119A/219A are capable of providing acceptable cooling liquid flow to the processing assemblies 120A-120N/220A-220N of both, the operational forward liquid distribution circuit and the failing forward liquid distribution circuit 115/215.

In this manner, the presented datacenter liquid cooling system 10 having sharing support capability via the liquid sharing support circuit 160 and associated switchover control/solenoid valve 145, 245 operates to minimize the damaging effects due to crucial flow component failures of a single liquid cooling arrangement by sharing liquid cooling components/resources of other operational liquid cooling arrangements as well as provide for routine or planned maintenance.

Figure 2:
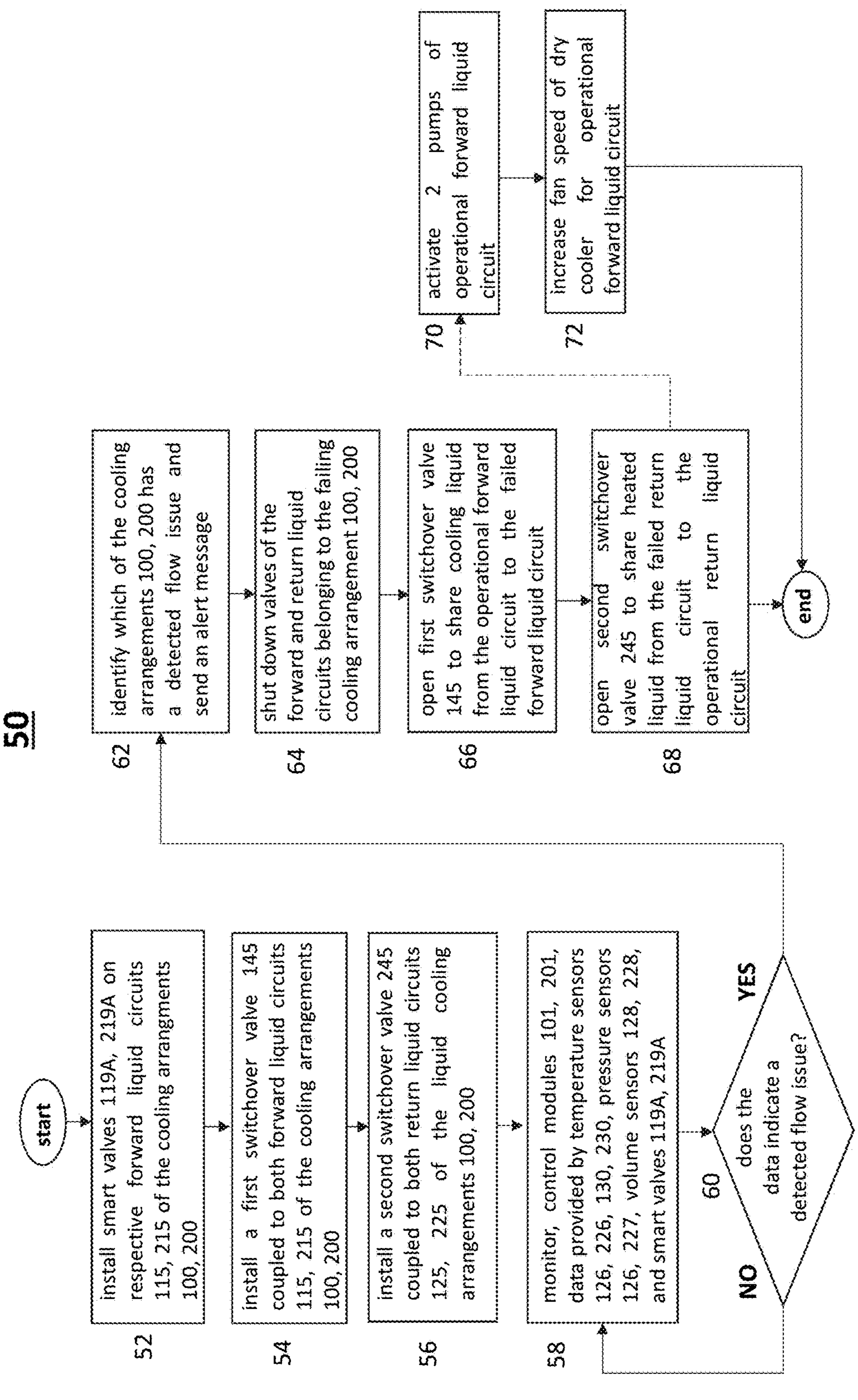
FIG. 2 illustrates a flow diagram of a datacenter liquid cooling resource sharing process in the event of component failure, in accordance with the nonlimiting embodiments of the present technology.

With this said, FIG. 2 illustrates a flow diagram of a datacenter liquid cooling resource sharing process 50 in the event of component failure, in accordance with the nonlimiting embodiments of the present technology. Process 50 or portions thereof may be executed by relevant components, such as, for example, smart control valves, switchover/solenoid valves or may equally be executed by the control module panels 101 and/or 201 of the corresponding first and second cooling arrangements 100, 200. For purposes of the instant disclosure, the exact entity or entities executing process 50 is not limiting with regard to the inventive concepts presented herein.

As shown, at task block 52, process 50 provides for the installation of forward smart control/solenoid valves 119A, 219A onto each of the respective forward cooling liquid distribution circuits 115, 215. At task block 54, process 50 provides for the installation of the first switchover/ABQM/solenoid valve 145 that is to be fluidly coupled to both forward cooling liquid distribution circuits 115, 215 and, at task block 56, for the installation of the second switchover/ABQM/solenoid valve 245 that is to be fluidly coupled to both return heated liquid distribution circuits 125, 225.

At task block 58, the control modules 101, 201 monitor the data reported by temperature sensors 126, 226, 130, 230, pressure sensors 126, 227, volume sensors 128, 228, and smart valves 119A, 219A. Then at decision block 60, process 50 determines whether the reported data indicates a detection of a liquid flow anomaly or failure. If no liquid flow anomalies or failures are detected, process 50 reverts back to task block 58 to continue monitoring the data reported by the temperature sensors 126, 226, 130, 230, pressure sensors 126, 227, volume sensors 128, 228, and smart valves 119A, 219A.

However, if the reported data to the control modules 101, 201 indicates a liquid flow anomaly/failure, at task block 62, process 50 identifies which of the first or second cooling arrangements 100, 200 has experienced a liquid flow issue and sends an alert message via the control modules 101, 201.

Based on the alert message, at task block 64, process 50 directs the shut down of the respective forward cooling liquid distribution circuit 115, 215 and return heated liquid distribution circuit 125, 225 of the first or second cooling arrangements 100, 200 identified as experiencing liquid flow issues. The shutting down of the identified liquid distribution circuits includes closing the related valves 119A, 119B or valves 219A, 219B. The closing of the related valves 119A, 119B, 219A, 219B may be conducted manually by an operator or automatically based on executable instructions issued by the control modules 101, 201 directly to the related valves 119A, 119B, 219A, 219B.

In turn, at task block 66, process 50 directs the opening of the first switchover valve 145 to route a suitable portion of the cooling liquid flow from the operational forward liquid distribution circuit 115/215 to the processing assemblies 120A-120N/220A-220N of the identified failing forward liquid distribution circuit 115/215. This allows for the sharing of the cooling liquid flow from the operational forward liquid distribution circuit 115, 215 to the identified failing forward liquid circuit.

Commensurately, at task block 68, process 50 directs the opening of the second switchover valve 245 to route a suitable portion of the heated liquid flow from the processing assemblies 120A-120N/220A-220N of the identified failing return liquid distribution circuit 125/225 to the operational return liquid distribution circuit 125/225 for re-cooling by the dry cooling unit 110/210. Again, this allows for the sharing of the heated liquid flow from the identified failing forward liquid circuit to the operational forward liquid distribution circuit 115, 215.

In various nonlimiting embodiments, process 50 terminates after the first and second switchover valves 145, 245 are opened to share resources between an operational cooling arrangement and an identified failing cooling arrangement 100, 200. However, in certain nonlimiting embodiments, process 50 may continue to task block 70 to activate both pumps 112A, 112B or 212A, 212B of the operational cooling arrangement to maximize the cooling liquid flow to the identified failing cooling arrangement 100, 200.

Additionally, in certain nonlimiting embodiments, process 50 may further continue to task block 72 to increase the speed of the fan assemblies 110A, 210A of the dry cooling unit 110, 210 pertaining to the operational cooling arrangement to further maximize the cooling liquid flow to the identified failing cooling arrangement 100, 200.

In this manner, the presented liquid cooling resource sharing process 50 operates to provide liquid support capability to failing liquid cooling arrangements by sharing liquid cooling components/resources of other operational liquid cooling arrangements.

While the above-described implementations have been described and shown with reference to particular steps performed in a particular order, it will be understood that these steps may be combined, sub-divided, or re-ordered without departing from the teachings of the present technology. At least some of the steps may be executed in parallel or in series. Accordingly, the order and grouping of the steps is not a limitation of the present technology.

Modifications and improvements to the above-described implementations of the present technology may become apparent to those skilled in the art. The foregoing description is intended to be exemplary rather than limiting. The scope of the present technology is therefore intended to be limited solely by the scope of the appended claims.

What is claimed is:

1. A datacenter liquid cooling system for cooling rack-mounted processing assemblies, comprising:
- a first cooling arrangement comprising:
  - a first dry cooling unit configured to supply a cooling liquid to the rack-mounted processing assemblies of the first cooling arrangement and receive a heated liquid from the rack-mounted processing assemblies of the first cooling arrangement,
  - a first forward liquid distribution circuit including a first forward liquid distribution circuit temperature sensor, at least one first pump, a pump pressure sensor, a liquid flow volume sensor, and a forward smart control solenoid valve to convey the cooling liquid from the first dry cooling unit to the rack-mounted processing assemblies, a first return liquid distribution circuit including a return smart control solenoid valve to convey the heated liquid from the rack-mounted processing assemblies back to the first dry cooling unit and a first return liquid distribution circuit temperature sensor, a first control module panel communicatively-coupled to the first forward liquid distribution circuit temperature sensor, pump pressure sensor, liquid flow volume sensor, the first return liquid distribution circuit temperature sensor, and forward smart control solenoid valve to receive data therefrom, each of the rack-mounted data processing assemblies of the first cooling arrangement comprising at least one heat-generating electronic processing element and at least one liquid cooling block arranged to be in respective thermal contact with the at least one heat-generating electronic processing element and fluidly-coupled to the first forward liquid distribution circuit and the smart control solenoid valves respectively arranged to be fluidly-coupled to the at least one liquid cooling block of the corresponding rack-mounted data processing assembly, and a second cooling arrangement comprising:

a second dry cooling unit configured to supply a cooling liquid to the rack-mounted processing assemblies of the second cooling arrangement and receive a heated liquid from the rack-mounted processing assemblies of the second cooling arrangement, a second forward liquid distribution circuit including a second forward liquid distribution circuit temperature sensor, at least one second pump, a pump pressure sensor, a liquid flow volume sensor, and a forward smart control solenoid valve, a second return liquid distribution circuit including a return smart control solenoid valve to convey the heated liquid from the rack-mounted processing assemblies back to the second dry cooling unit and a second return liquid distribution circuit temperature sensor, a second control module panel communicatively-coupled to the second forward liquid distribution circuit temperature sensor, pump pressure sensor, liquid flow volume sensor, second return liquid distribution circuit temperature sensor, and forward smart control solenoid valve to receive data therefrom, each of the rack-mounted data processing assemblies of the second cooling arrangement comprising at least one heat-generating electronic processing element and at least one liquid cooling block arranged to be in respective thermal contact with the at least one heat-generating electronic processing element and fluidly-coupled to the first liquid distribution circuit and smart control solenoid valves respectively arranged to be fluidly-coupled to the at least one liquid cooling block of the corresponding rack-mounted data processing assembly;

a liquid sharing support circuit comprising:

a first switchover control valve fluidly coupled to the forward liquid distribution circuits of the corresponding first and second cooling arrangements that convey the cooling liquid from the respective first and second dry cooling units, a second switchover control valve fluidly coupled to the return liquid distribution circuits of the corresponding first and second cooling arrangements that convey the heated liquid back to the respective first and second dry cooling units; and wherein, in response to receiving data indicating a detected liquid flow failure, the first or second control module panels operate to:

identify which of the forward liquid distribution circuits has experienced a detected liquid flow failure, shut down the respective forward cooling liquid distribution circuit and return heated liquid distribution circuit of the identified failing first or second cooling arrangements, open the first switchover control valve to route a suitable portion of the cooling liquid flow from the operational forward liquid distribution circuit to the identified failing forward liquid distribution circuit, and open the second switchover control valve to route a suitable portion of the heated liquid flow from the identified failing return liquid distribution circuit to the operational return liquid distribution circuit.

2. The datacenter liquid cooling system of claim 1, wherein the first switchover control valve is fluidly coupled to the first and second forward liquid distribution circuits at respective coupling points that are proximately disposed downstream from the respective forward smart control solenoid valves and upstream from the respective processing assemblies.

3. The datacenter liquid cooling system of claim 1, wherein the second switchover control valve is fluidly coupled to the second return liquid distribution circuits at respective coupling points that are proximately disposed downstream from the respective processing assemblies and upstream from the respective return smart control solenoid valves.

4. The datacenter liquid cooling system of claim 1, wherein each of the control panel modules of the first and second cooling arrangements are configured to monitor the received data from the respective temperature sensors, pump pressure sensors, volume sensors, and forward smart control solenoid valves to determine a detected liquid flow failure and issue alerts regarding corresponding detected liquid flow failures of a cooling arrangement.

5. The datacenter liquid cooling system of claim 1, wherein the shutting down of the identified failing liquid distribution circuits includes closing the forward and return smart control solenoid valves corresponding to the identified failing first or second cooling arrangement.

6. The datacenter liquid cooling system of claim 5, wherein the closing of the identified failing liquid distribution circuits valves and the opening of the first and second switchover control valves are automatically initiated based on executable instructions provided by the control module panels.

7. The datacenter liquid cooling system of claim 6, wherein the closing of the identified failing liquid distribution circuits valves and the opening of the first and second switchover control valves are conducted manually by an operator in response to issue alerts provided by the control module panels.

8. The datacenter liquid cooling system of claim 1, wherein, after opening the first and second switchover control valves, the control module panels operate to activate both pumps of the operational forward liquid distribution circuit and/or activate evaporative dry cooling to maximize liquid cooling flow routed to the identified failing cooling arrangement.

9. The datacenter liquid cooling system of claim 1, wherein, after opening the first and second switchover control valves, the control module panels operate to increase a speed of fan assemblies of the dry cooling unit pertaining to the operational cooling arrangement to maximize the cooling liquid flow routed to the identified failing cooling arrangement.

10. A liquid cooling method for a datacenter system in which:

the datacenter system includes:

a first cooling arrangement comprising a first dry cooling unit configured to supply a cooling liquid to respective rack-mounted processing assemblies and receive a heated liquid from the respective rack-mounted processing assemblies, a first forward liquid distribution circuit including a first forward liquid distribution circuit temperature sensor, at least one first pump, a pump pressure sensor, a liquid flow volume sensor, and a forward smart control solenoid valve to convey the cooling liquid from the first dry cooling unit to the respective rack-mounted processing assemblies, a first return liquid distribution circuit including a return smart control solenoid valve to convey the heated liquid from the respective rack-mounted processing assemblies back to the first dry cooling unit and a first return liquid distribution circuit temperature sensor, a first control module panel communicatively-coupled to the temperature sensor, pump pressure sensor, liquid flow volume sensor, the first forward and return liquid distribution circuit temperature sensors, and forward smart control solenoid valve to receive data therefrom, and a second cooling arrangement comprising a second dry cooling unit configured to supply a cooling liquid to respective rack-mounted processing assemblies and receive a heated liquid from the respective rack-mounted processing assemblies, a second forward liquid distribution circuit including a second forward liquid distribution circuit temperature sensor, at least one second pump, a pump pressure sensor, a liquid flow volume sensor, and a forward smart control solenoid valve, a second return liquid distribution circuit including a return smart control solenoid valve to convey the heated liquid from the rack-mounted processing assemblies back to the second dry cooling unit and a second return liquid distribution circuit temperature sensor, a second control module panel communicatively-coupled to the temperature sensor, pump pressure sensor, liquid flow volume sensor, temperature sensor, and forward smart control solenoid valve to receive data therefrom;

the liquid cooling method comprising:

providing a liquid sharing support circuit that includes:

providing a first switchover control valve fluidly coupled to the forward liquid distribution circuits of the corresponding first and second cooling arrangements that convey the cooling liquid from the respective first and second dry cooling units, and providing a second switchover control valve fluidly coupled to the return liquid distribution circuits of the corresponding first and second cooling arrangements that convey the heated liquid back to the respective first and second dry cooling units;

wherein, in response to receiving data indicating a detected liquid flow failure, the first or second control module panels operate to:

identify which of the forward liquid cooling circuits has experienced a detected liquid flow failure, shut down the respective forward cooling liquid distribution circuit and return heated liquid distribution circuit of the identified failing first or second cooling arrangements, open the first switchover control valve to route a suitable portion of the cooling liquid flow from the operational forward liquid distribution circuit to the identified failing forward liquid distribution circuit, and open the second switchover control valve to route a suitable portion of the heated liquid flow from the identified failing return liquid distribution circuit to the operational return liquid distribution circuit.

11. The liquid cooling method of claim 10, wherein each of the control module panels are configured to monitor the received data from the respective temperature sensors, pump pressure sensors, volume sensors, and forward smart control solenoid valves to determine a detected liquid flow failure and issue alerts regarding corresponding detected liquid flow failures of a cooling arrangement.

12. The liquid cooling method of claim 10, wherein the shutting down of the respective forward cooling liquid distribution circuit and return heated liquid distribution circuit of the identified failing first or second cooling arrangements includes shutting down the valves of the identified failing liquid distribution circuit and the opening of the first and second switchover control valves which are automatically initiated based on executable instructions provided by the control panel modules.

13. The liquid cooling method of claim 12, wherein the shutting down of the identified failing liquid distribution circuits valves and the opening of the first and second switchover control valves are conducted manually by an operator in response to issue alerts provided by the control module panels.

14. The liquid cooling method of claim 10, wherein, after opening the first and second switchover control valves, the control module panels operate to activate both pumps of the operational forward liquid distribution circuit of the first and second cooling arrangements to maximize liquid cooling flow routed to the identified failing cooling arrangement.

15. The liquid cooling method of claim 10, wherein, after opening the first and second switchover control valves, the control module panels operate to increase a speed of fan assemblies of the dry cooling unit pertaining to the operational cooling arrangement to maximize the cooling liquid flow routed to the identified failing cooling arrangement.

* * * * *